United States Patent [19]

Shimizu

[11] Patent Number: 4,762,267
[45] Date of Patent: Aug. 9, 1988

[54] WIRE BONDING METHOD

[75] Inventor: Yasuhiko Shimizu, Yokohama, Japan

[73] Assignee: Kabushiki Kaisha Toshiba, Kawasaki, Japan

[21] Appl. No.: 101,424

[22] Filed: Sep. 28, 1987

[30] Foreign Application Priority Data

Sep. 29, 1986 [JP] Japan .................. 61-230844

[51] Int. Cl.⁴ ............................................. B23K 31/02
[52] U.S. Cl. .................... 228/179; 228/213; 228/4.5
[58] Field of Search ................. 228/111, 4.5, 213, 179

[56] References Cited

U.S. PATENT DOCUMENTS 3,909,933 10/1975 Doubek, Jr. et al. .......... 228/213 X
4,583,676 4/1986 Pena et al. ............................ 228/179
4,597,522 7/1986 Kobayashi ........................... 228/179

FOREIGN PATENT DOCUMENTS 53-66167 6/1978 Japan .

Primary Examiner—Nicholas P. Godici
Assistant Examiner—Carmine Cuda
Attorney, Agent, or Firm—Foley & Lardner, Schwartz, Jeffery, Schwaab, Mack, Blumenthal & Evans

[57] ABSTRACT

This wire bonding method is preferably applied to wire bonding for an elongated semiconductor chip. This method includes a first step of chucking a semiconductor chip by a chuck table to conduct bonding between the bonding pads and electrodes within a bonding region of a wire bonder, a second step of releasing the chucking by the chuck table to convey the semiconductor chip by a predetermined pitch, and a third step of turning the chuck table so that it becomes in alignment with the semiconductor having been conveyed by the predetermined pitch. This method further includes a fourth step of chucking the semiconductor chip by the chuck table to carry out wire bonding between the bonding pads of the semiconductor chip and the electrodes for a second time. Since there is no need to rotate the semiconductor chip in this method, positioning is facilitated and precisely carried out. Thus, bonding operation is simplified and its high speed implementation is possible.

8 Claims, 2 Drawing Sheets

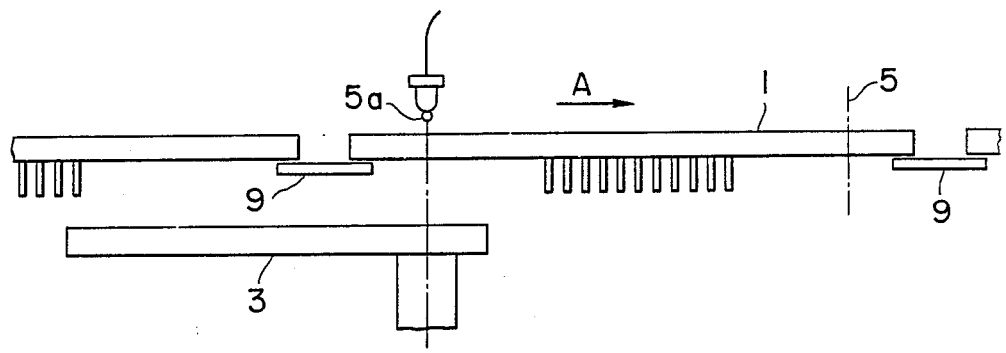
F I G. 4
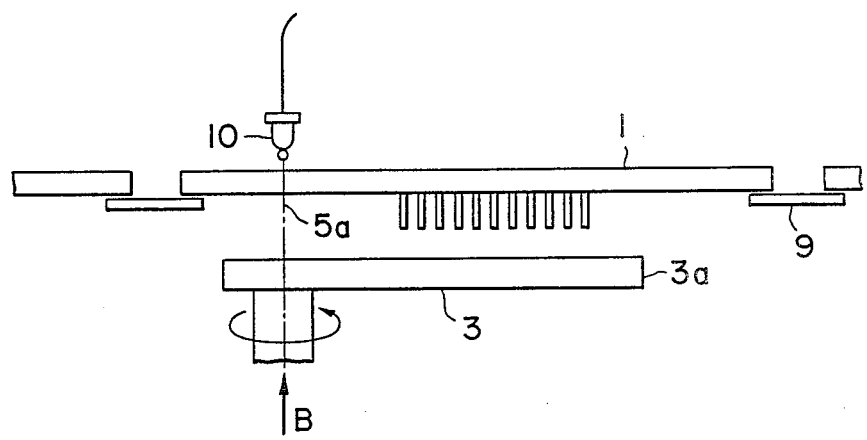
F I G. 5

WIRE BONDING METHOD

BACKGROUND OF THE INVENTION

The present invention relates to a wire bonding method of carrying out wire bonding between a semiconductor chip and a package, and more particularly to a method to apply wire bonding to an elongated semiconductor chip such as, for example, a solid state image pick-up device.

A semiconductor chip used in a solid state image pick-up device is of an elongated structure such that the width is 1 mm whereas the length is 30 to 100 mm. A plurality of bonding pads serving as electrodes of such an elongated semiconductor chip are arranged along its length direction in a column manner. Accordingly, the bonding range required for applying wire bonding to such bonding pads thus arranged in a broad range is broader than the bonding range in an ordinary semiconductor chip. For this reason, the special bonding methods described below have been conventionally applied.

(1) Selecting the central portion in the length direction of a semiconductor chip as a branch point, bonding pads arranged on one side of the branch point are first subjected to bonding using a wire bonder. Then, half turn of the semiconductor chip is made with the branch point being as center to apply bonding to bonding pads arranged on the opposite side of the branch point using the wire bonder. This method is particularly applied to the ultrasonic bonding.

(2) A semiconductor chip is intermittently moved with respect to a wire bonder. Thus, wire bonding is successively applied at respective movement positions.

(3) A plurality of wire bonders are disposed along the length direction of a semiconductor chip to carry out bonding using respective wire bonders.

However, the above-mentioned method (1) requires positional accuracy when rotating the semiconductor chip. Particularly, where bonding pads are formed at the end portion in the length direction of the semiconductor chip, it is required to maintain accuracy at the end point. For this reason, it is necessary to calculate coordinates of the bonding position. In addition, movement stroke of an X-Y table on which the wire bonder is mounted becomes large, with the result that the wire bonder becomes large-sized. On the other hand, the above-mentioned method (2) requires positioning of the semiconductor chip every time the semiconductor chip is intermittently moved, resulting in prolonged loss time and troublesome operation. Further, the last-mentioned method (3) requires a large number of wire bonders, so that the entirety of the wire bonding apparatus becomes complicated and the cost therefor is increased.

SUMMARY OF THE INVENTION

The present invention has been made in consideration of the above and its object is to provide a wire bonding method which can be preferably implemented to a wire bonding for an elongated semiconductor chip.

The above-mentioned object is achieved by a wire bonding method of carrying out, using a wire bonder, wire bonding between bonding pads formed on an elongated semiconductor chip and electrodes formed on a package with the semiconductor chip being chucked by a chuck table, the method comprising: a first step of chucking the semiconductor table by the chuck table to carry out wire bonding between bonding pads and electrodes within a bonding region of the wire bonder; a second step of releasing chucking by the chuck table to convey the semiconductor chip by a predetermined pitch; a third step of turning the chuck table so that it becomes in alignment with the semiconductor chip having been conveyed by the predetermined pitch; and a fourth step of chucking the semiconductor chip by the chuck table to carry out wire bonding between the bonding pads of the semiconductor chip and the electrodes which have reached the bonding region of the wire bonder.

BRIEF DESCRIPTION OF THE DRAWINGS

In the accompanying drawings:

FIG. 4 is a front view showing the positional relationship of the semiconductor chip, the chuck table and the wire bonder at a second step of the wire bonding method according to the present invention; and FIG. 5 is a front view showing the positional relationship of the semiconductor chip, the chuck table and the wire bonder at a third step of the wire bonding method according to the present invention.

DETAILED DESCRIPTION OF THE INVENTION

The present invention will be described in more detail with reference to attached drawings.

Figure 1:
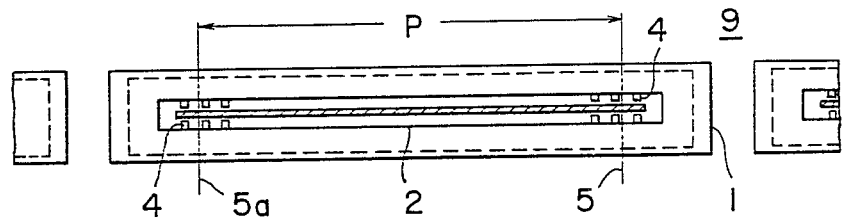
FIGS. 1 to 3 are a plan view, a front view and a side view showing the positional relationship of a semiconductor chip, a chuck table, and a wire bonder at a first step in a wire bonding method according to the present invention, respectively.
Figure 2:
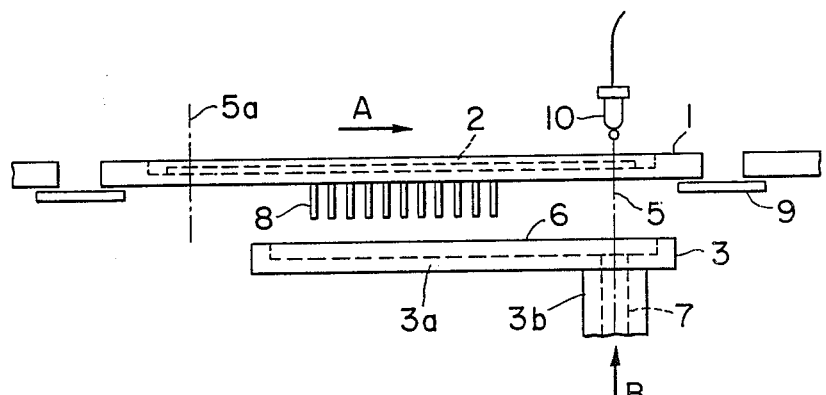
Figure 3:
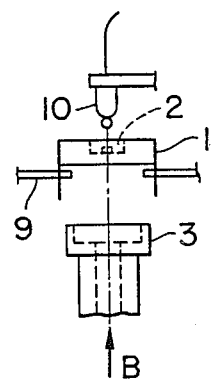

A wire bonding method according to the present invention comprises a first step of chucking a semiconductor chip on a conveyance path by a chuck table to conduct a wire-bonding within a range capable of bonding by a wire bonder, a second step of moving the semiconductor chip by a predetermined pitch after the bonding is completed, a third step of turning the chuck table for chucking the semiconductor chip which has been moved, and a fourth step of chucking for a second time the semiconductor chip by the chuck table which has been turned to carry out a wire bonding. FIGS. 1 to 3 are a plan view, a front view and a side view showing the positional relationship of the semiconductor chip, the chuck table, the wire bonder at the first step, respectively. FIG. 4 is a front view showing the semiconductor chip, the chuck table and the wire bonder at the second step. FIG. 5 is a front view showing the positional relationship of the semiconductor chip, the chuck table and the wire bonder at the third step. In the embodiment shown, wire bonding is carried out with an elongated semiconductor chip 2 being set within a package 1. In this embodiment, bonding pads 4 are formed in the vicinity of both the ends in the length direction of the semiconductor chip 2. The package 1 is formed of a stacked ceramic plate or a molded synthetic resin. On a recessed portion into which the semiconductor chip 2 is accommodated, bonding pads 4 and electrodes (not shown) subject to bonding are formed by a printing means, etc. Reference numeral 8 denotes outer leads. By inserting these outer leads 8 into a socket (not shown) of an external equipment, supply of power and transmission and reception of signals are conducted. The semiconductor chip 2 is conveyed in the length direction of the semiconductor chip 2 along the conveyance path with it being subjected to positioning and set in advance within the package 1. The conveyance path comprises a carrier 9 on which the package 1 in which the semiconductor chip 2 is set is mounted, and a work feeder (not shown) for moving the carrier 9. For the carrier 9, a conveyer, e.g., an endless belt, etc. are used. For implementing chucking by a chuck table 3 which will be described later, elongated holes along the length direction of the package 1 are suitably opened. The bonding head 10 of the wire bonder for carrying out wire bonding is provided at a fixed position of such a conveyance path. The bonding head 10 of the wire bonder electrically connects between the bonding pads 4 of the semiconductor chip 2 and the electrodes of the package 1 by means of bonding wires such as gold wires or aluminum wires. Below the bonding head 10, a chuck table 3 which conducts chucking of the package 1 at the time of wire bonding is provided. The chuck table 3 is L-shaped and comprises a chuck plate 3a along the lower surface of the package 1 and a shaft body 3b for supporting the chuck plate 3a which are integrally formed with each other. This chuck table 3 is connected to rotating means (not shown), e.g., a motor, a cylinder, etc. Thus, the chuck table 3 is of a structure such that it turns along the horizontal surface when driven by the rotating means. The chucking of the package 1 is carried out by vacuum suction in this embodiment. A suction groove 6 is formed on the upper surface of the chuck plate 3a and a suction hole 7 is formed in the shaft body 3b. These members are connected to a vacuum pump (not shown), etc.

At the first step, the semiconductor chip 2 is conveyed in a direction indicated by an arrow A in FIG. 2 by the carrier 9 with the semiconductor chip 2 being set within the package 1. When the package 1 reaches a position above the chuck table 3, the chuck table 3 rises in a direction indicated by an arrow B, so that it becomes in contact with the lower surface of the package 1 to chuck the package 1 by vacuum suction. Thus, the movement of the package 1 is stopped and retained at a fixed position below the bonding head 10 of the wire bonder. In this instance, the chucking of the package 1 is carried out in a manner that the bonding pads 4 on the downstream side in the conveyance direction (on the right side in the example shown) are positioned below the bonding head 10 of the wire bonder. Namely, such a chucking is conducted so that the bonding head 10 of the wire bonder is stopped at a position indicated by single dotted lines 5. Then, in this condition, bonding is implemented to the bonding pads 4 located at the above position and the electrodes of the package 1 by ultrasonic wave. Namely, the bonding pads 4 within the bonding region (on the side of the right end of the semiconductor chip) of the wire bonder and the electrodes are subjected to bonding (bonding at a first stage).

After the bonding at the first stage is completed, the wire bonding operation shifts to a second step. At the second step, as shown in FIG. 4, the chuck table 3 lowers to release chucking. Thus, the semiconductor chip 2 is conveyed along with the package 1 in a direction indicated by an arrow A by the carrier 9. Such a conveyance is carried out at a predetermined pitch P defined as a distance required until the bonding pads 4 formed on the upstream side (on the side of the left end in the example shown) are positioned below the bonding head 10 of the wire bonder. Thus, a portion of the package indicated by single dotted lines 5a is positioned below the bonding head 10 of the wire bonder.

Then, at a third step, as shown in FIG. 5, the chuck plate 3a of the chuck table 3 is turned by an angle of 180 degrees so that it becomes in alignment with the lower surface of the package 1. Accordingly, the chuck plate 3a is positioned directly below the package 1 to shift to a fourth step. Since the fourth step is executed in the same procedure as that at the first step, its illustration is omitted. At the fourth step, the chuck table 3 rises first to chuck the package 1. Since the chuck table 3 is turned and positioned along the lower surface of the package 1 in this chucking, there is no possibility that the chuck table 3 is in contact with a new package 1 subsequently conveyed. Then, the bonding pads 4 positioned within the bonding region (in a vicinity of the area indicated by single dotted lines 5a) and the electrodes of the package 1 are subjected to wire bonding by ultrasonic wave (bonding at a second stage). Thus, wire bonding of all the bonding pads 4 formed on both the ends in the length direction of the semiconductor chip 2 is completed. Then, the chuck table 3 lowers and thus the semiconductor chip 2 is conveyed along with the package 1 by the carrier 9. Simultaneously with this conveyance, a new semiconductor chip 2 of the next stage is conveyed together with the package 1, thus to conduct a new wire bonding. In this wire bonding, the above-mentioned first to fourth steps are repeatedly conducted. In this instance, the chuck table 3 is turned in a direction opposite to the above, so that it is returned to the state shown in FIG. 2 to carry out chucking of the new package 1 at the position indicated by the single dotted lines 5.

As just described above, since it is unnecessary to rotate an elongated semiconductor chip when the above-mentioned method is employed, the positioning of the semiconductor chip is simple and can be precisely carried out. Further, since all of the wire bonding is completed by only one conveyance of a semiconductor chip, the work therefor is simplified. Furthermore, there is no need to juxtapose a large number of wire bonders, thus making it possible to simplify and reduce in size the entirety of the wire bonding apparatus.

It is to be noted that the present invention is applicable not only to the case where bonding pads are formed concentrically in the vicinity of both the ends of a semiconductor chip, but also to the case where they are formed over the entire region of the semiconductor chip in the same manner as in the former case. In this case, the semiconductor chip is conveyed at a pitch which is in conformity with the bonding region of the wire bonder.

Moreover, chucking by the chuck table may be mechanically carried out.

In the above-mentioned embodiment, an explanation has been made in connection with the element of the type in which a semiconductor chip is accommodated within a package. In addition, the present invention is applicable to a wire bonding with an elongated semiconductor chip being mounted on a lead frame.

As described above, the wire bonding method according to the present invention is implemented to effect chucking of a semiconductor chip by turning a chuck table, thus to carry out wire bonding without rotating the semiconductor chip. Accordingly, this method allows positioning to be facilitated and correct, with the result that bonding operation is simplified and its high speed implementation is possible.

What is claimed is:

1. A wire bonding method, using a wire bonder, for wire bonding between bonding pads formed on an elongated semiconductor chip and electrodes connected to outer leads with said semiconductor chip being chucked by a chuck table, said method comprising in sequence:
- a first step of chucking said semiconductor chip by said chuck table and carrying out bonding between a first set of bonding pads and electrodes within a bonding region of said wire bonder;
- a second step of releasing the chucking by said chuck table and conveying said semiconductor chip by a predetermined pitch;
- a third step of turning said chuck table so that it becomes in alignment with said semiconductor chip having been conveyed by said predetermined pitch; and
- a fourth step of chucking said semiconductor chip by said chuck table and carrying out wire bonding between a second set of bonding pads of said semiconductor chip and electrodes which have reached said bonding region of said wire bonder.

2. A wire bonding method as set forth in claim 1, wherein said wire bonder carries out wire bonding by making use of ultrasonic wave.

3. A wire bonding method as set forth in claim 2, wherein said chuck table conducts chucking of said semiconductor chip by vacuum suction.

4. A wire bonding method as set forth in claim 3, wherein the chuck surface of said chuck table is asymmetrically formed with respect to a turning axis.

5. A wire bonding method as set forth in claim 2, wherein the chuck surface of said chuck table is asymmetrically formed with respect to a turning axis.

6. A wire bonding method as set forth in claim 1, wherein said chuck table conducts chucking of said semiconductor chip by vacuum suction.

7. A wire bonding method as set forth in claim 6, wherein the chuck surface of said chuck table is asymmetrically formed with respect to a turning axis.

8. A wire bonding method as set forth in claim 1, wherein the chuck surface of said chuck table is asymmetrically formed with respect to a turning axis.

* * * * *